United States Patent [19]

Belcher

[11] 4,041,410
[45] Aug. 9, 1977

[54] RF LEVEL DETECTOR

[75] Inventor: Donald Keith Belcher, Melbourne, Fla.

[73] Assignee: Harris Corporation, Cleveland, Ohio

[21] Appl. No.: 675,761

[22] Filed: Apr. 12, 1976

[51] Int. Cl.² ............................................. H03G 3/20
[52] U.S. Cl. .................................... 330/129; 330/53; 330/207 P; 333/17 L
[58] Field of Search ....................... 325/133, 150, 151; 330/53, 129, 207 P; 333/17, 17 L; 328/54, 175

[56] References Cited

U.S. PATENT DOCUMENTS 3,449,680  6/1969  Shilb et al. .................. 330/207 P X Primary Examiner—Rudolph V. Rolinec
Assistant Examiner—Lawrence J. Dahl

[57] ABSTRACT

A circuit for detecting the amplitude of a RF signal propagating along a transmission line. A plurality of rectification circuits, each including a diode and a filter capacitor, are located at different positions along the line. The signal electrodes of the capacitors are connected together to thereby non-additively combine the signals seen at each rectifier.

The spacing between the rectifier circuits is carefully selected and will vary with the number of rectifier circuits used. If two rectifiers are employed, the distance therebetween may conveniently be equal to an odd multiple of one-quarter of the wavelength of the driving signal. For this spacing, the combined signal will never fall below the amplitude of the signal produced when the transmission line is terminated with a perfectly matched load. Additionally, the output of the detector will be generally responsive to VSWR. Other RF level detectors having greater numbers of rectifier circuits are also described.

In one embodiment, the detector output is directed to the gain control input of an RF amplifier to provide feedback stabilization thereof. Because the voltage level is sensed on the transmission line, high VSWR will cause a high rectifier output, thus automatically reducing drive to the power amplifier.

6 Claims, 5 Drawing Figures

RF LEVEL DETECTOR

The present invention relates to the art of RF power amplification control, and more particularly to the art of RF level sensing along a transmission line.

In the generation or amplification of electrical signals it is often desirable to enclose the final stages of the circuit within a feedback loop to stabilize the circuit against changes in load conditions. This presents particular problems in the generation of RF signals. Although an RF amplifier may be stabilized by sensing the voltage directly at the output point and utilizing this signal to control the gain of the amplifier, it is frequently inadequate to protect the amplifier against severely mismatched load impedance conditions. A poor match between the load impedance and the characteristic impedance of the transmission line will produce a high VSWR condition which may damage the amplifier. Prior attempts to solve this problem have included the use of directional couplers, which serve to monitor and compare parameters indicative of forward and reflected power. An example of such a system is set forth in U.S. Pat. No. 3,852,669. The cost and complexity of this approach render its use impractical for many applications.

It is therefore an object of the present invention to provide a RF level detector which is sensitive to mismatched load conditions.

It is another object of the present invention to provide a RF level detector which is both simple and inexpensive.

It is yet another object of the present invention to provide a feedback stabilized RF amplifier circuit which is VSWR protected.

In accordance with the present invention, means are provided for peak detecting the level of RF signal at a plurality of points along the transmission line. The sensing points are located at carefully selected distances from one another. The detected signals are nonadditively combined to provide an output signal indicative of the level of the RF signal propagating along the transmission line, and responsive to changes in VSWR.

In accordance with another aspect in the present invention, the output signal provided by such level detection means is directed to a previous stage of amplification of the driving signal to modulate the amplitude of the RF signal propagating along the transmission line.

DESCRIPTION OF THE DRAWING

The foregoing and other objects and advantages of the present invention will become more readily apparent through the following description of the preferred embodiments as taken in conjunction with the accompanying drawings which are a part hereof and wherein.

DETAILED DESCRIPTION

As is well known in the art, propagation of RF signals along a transmission line which is terminated with a mismatched impedance will result in the creation of standing waves thereon. The amplitude of the standing wave will vary as a function of reflection coefficient and position along the transmission line according to the equation:

$$|V| = |V^+| \, [(1 + \rho)^2 - 4\rho \sin^2 \phi]^{\frac{1}{2}} \quad (1)$$

where;

$|V^+|$ is the amplitude of the forward voltage wave,
$\rho$ is the reflection coefficient,
$\phi$ can be viewed as the angular distance along the line from a standing wave peak, and
$|V|$ is the amplitude of the standing wave.

With respect to position, the minimum amplitude will occur when the sine term is maximized, i.e., where $\phi$ equal 90°. This reduces equation (1) to:

$$|V| = |V^+| (1 - \rho) \quad (2)$$

Similarly, the maximum will occur where the since term is minimized, i.e., where $\phi = 0°$. This would reduce equation (1) to:

$$|V| = |V^+| (1 + \rho) \quad (3)$$

Figure 1:
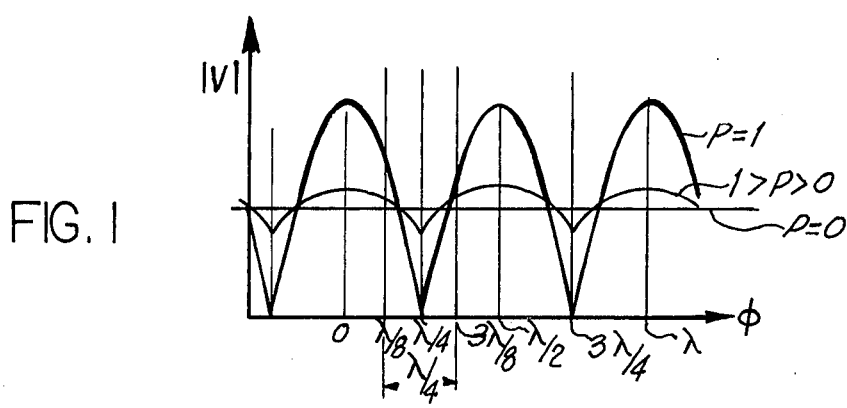
FIG. 1 is a graphic representation of the absolute magnitude of the standing wave along a transmission line for various reflection coefficients.

FIG. 1 provides a graph of the amplitude of the standing wave as a function of distance along the transmission line for three reflection coefficient values.

As stated previously, directional couplers have been used in the prior art to sense the magnitude of the reflected power and control the gain of an amplifier in accordance therewith. A second method of accomplishing this would be to provide a rectifier circuit at a known position in the standing wave, for example, at a position where the standing wave reaches a maximum, and sence the RF level at that point.

Figure 2:
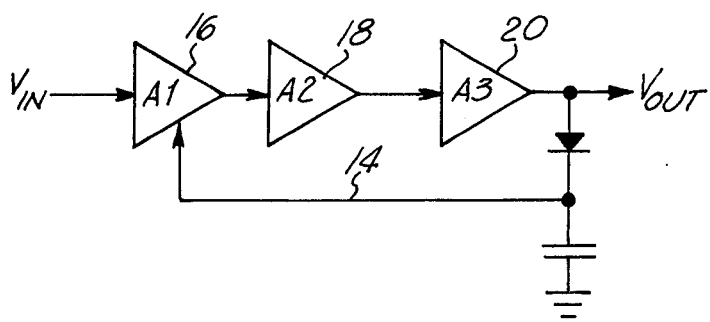
FIG. 2 is a circuit diagram of the basic detector mechanism utilized herein.

As shown in FIG. 2, this could be accomplished through the use of a simple diode rectifier circuit comprised of a diode 10 and a capacitor 12. The output of the rectifier 14 could then be directed to a prior stage of amplification to control the gain thereof. For example, three stages of amplification 16, 18, and 20 may be included with output 14 being connected to the gain control input of stage 16.

It will be noted, however, that the use of this method would not protect the amplifiers against an antenna fault at an unknown position along the transmission line. For example, if the transmission line were to open-circuit at a position which were distance from the rectifier by a multiple of one-half of the wavelength of the driving signal, the rectifier would lie in a null, and would not sense the overdriving condition. In fact, the rectifier would sense a drop in RF level and would attempt to increase the level of drive of amplifier 16.

Figure 3:
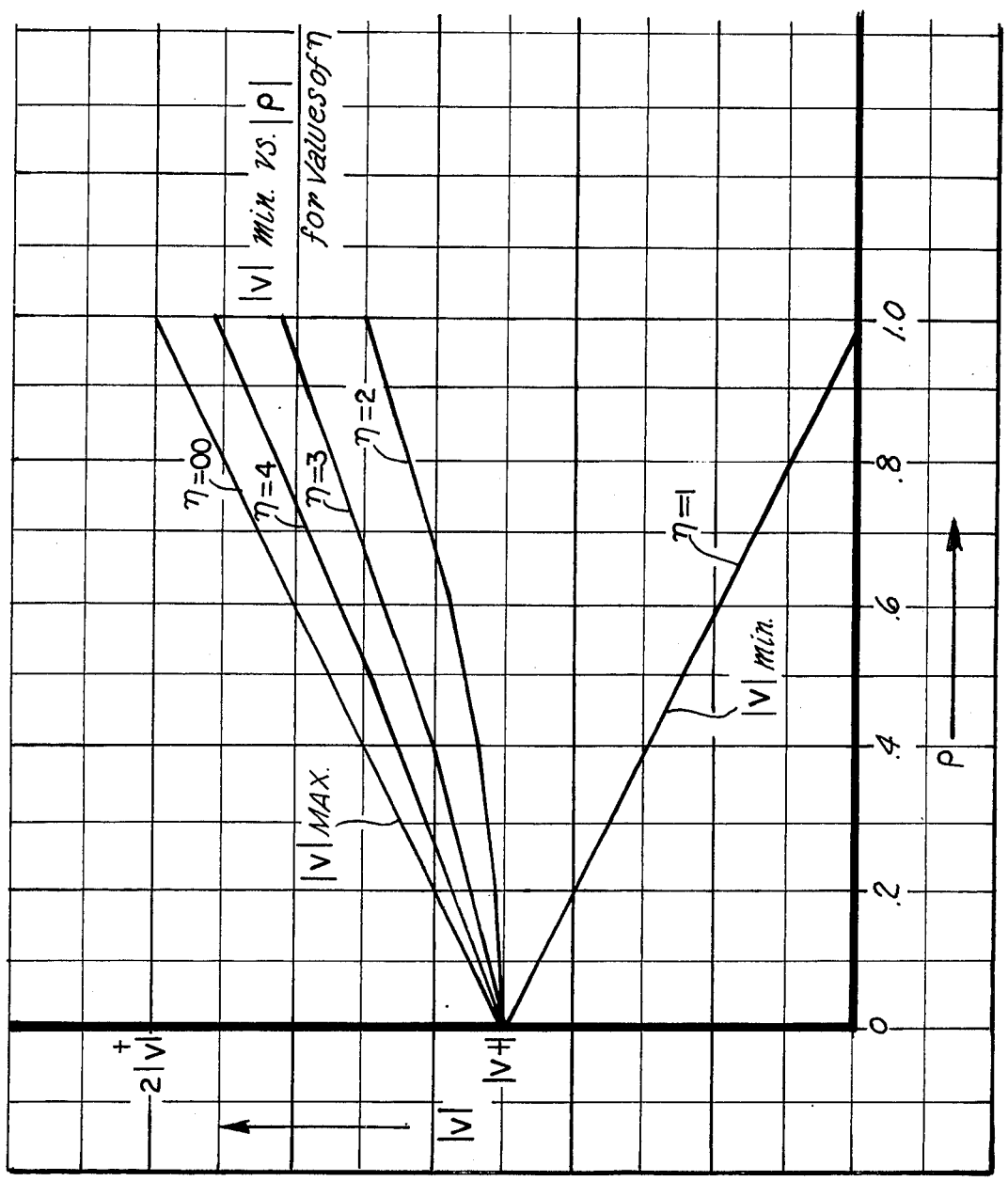
FIG. 3 is a graph of the worst case outputs of various embodiments of the invention with respect to reflection coefficient.

In this "worst case" positioning of the detector relative to the standing wave, the detector output will reflect the minimum amplitude of the standing wave and can be characterized by equation (2). This equation is graphically depicted in FIG. 3 as the "$n = 1$" case (where $n$ represents the number of rectifier positions).

Figure 4:
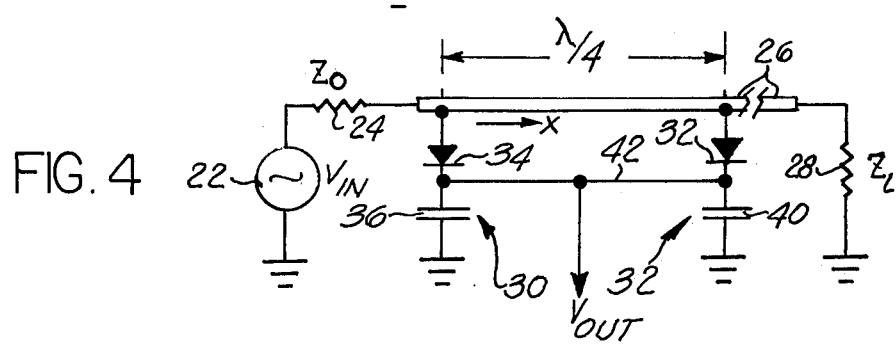
FIG. 4 is a simplified circuit diagram of a RF level detector in accordance with the present invention.

The present invention overcomes this difficulty by sensing the RF level at more than one point along the transmission line. As shown in FIG. 4, a RF signal source 2 has an output impedance 24 serves to produce a RF signal along a transmission line 26 which terminates in a load impedance 28. Terminating impedance 28 may, for example, be an antenna element. Level detection is accomplished through use of two rectifier circuits 30 and 32, spaced apart by a distance equal to one-quarter of the wavelength of the driving signal. Each rectifier circuit includes a diode and a capacitor. Specifically, rectifier 30 includes diode 34 and capacitor 36, and rectifier 32 includes diode 38 and capacitor 40. The signal electrodes of capacitors 36 and 40 are shorted together such that the signals detected thereby are nonadditively combined. The combined signal will be equal to the greater of the two detected signals and will appear on output line 42.

A separate capacitor is provided for each of the rectifiers to insure accuracy of the detected voltage. If capacitor 36 were deleted from the circuit, standing waves would develop between diode 34 and capacitor 32 which would increase the inaccuracy of the detector output voltage. By providing capacitors locally adjacent each rectifer, the A.C. signal path is decreased and the problem of standing waves is reduced accordingly.

The worst case for this circuit arises when the two rectifiers symmertically straddle a null in the stranding wave. Each rectifier will then be spaced $\lambda/8$ away from a standing wave peak, thus $\phi = 45°$. For this positioning, equation (1) reduces to:

$$|V| = |V^+| (1 + \rho^2) \quad (4)$$

Referring again to FIG. 3, the graph of this equation is labeled $n = 2$. This clearly represents a dramatic improvement over the single rectifier case. More specifically, it will be noted that the combined detector output will never fall below the output produced by a matched load condition, i.e., where $\rho = 0$. Further, the output increases with increasing VSWR ($\rho > 0$).

In view of the foregoing, it will be appreciated that the accuracy of the RF detection can be increased to any desired limit by increasing the number of rectifier circuits employed. As the number of rectifiers is increased, the sample length (i.e., the length of transmission line over which the rectifiers are arrayed) is also increased. Obviously, the sample length should not exceed $\lambda/2$.

Care should be taken in spacing the rectifiers one from another. In the case of level detection utilizing three rectifiers, a spacing of 3 $\lambda/16$ was conveniently used to provide the worst case results labeled "$n = 3$" in FIG. 3. Four rectifiers with a spacing of $\lambda/8$ produced the "$n = 4$" curve. These arrangements are summarized below:

| n | spacing | total sample length | "worst case" $\phi$ |
|---|---|---|---|
| 2 | $\lambda/4$ | $\lambda/4$ | 45° |
| 3 | $3\lambda/16$ | $3\lambda/8$ | 33.75° |
| 4 | $\lambda/8$ | $3\lambda/8$ | 22.5° |

These spacings are not necessarily optimal but are included for exemplary purposes only. Further, it will be understood the equivalent spacings over greater then $\lambda/2$ are also within the contemplation of the present invention; e.g., a spacing of $5\lambda/8$ for $n = 4$.

If an infinite number of rectifiers were employed, that detector output would, of course, alway reflect the standing wave peak, regardless of position or reflection coefficient.

Figure 5:
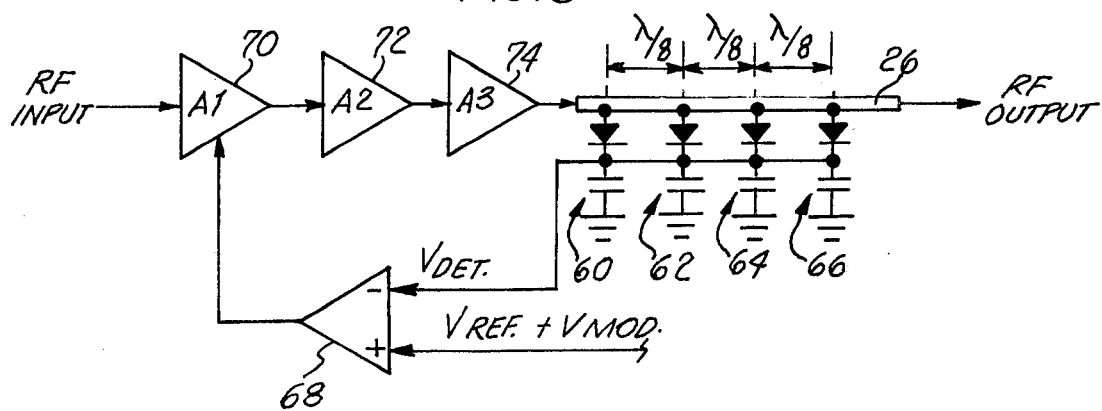
FIG. 5 is a circuit diagram of a practical application of the present invention.

FIG. 5 illustrates a preferred embodiment of the present invention utilizing four rectifier circuits 60, 62, 64, and 66 spaced equally apart by a distance equal to ⅛ths of the wavelength of the driving signal. The combined signal, indicated in FIG. 5 as $V_{det}$, is fed to a control amplifier 68 to provide the necessary feedback to gain-controlled RF amplifier 70.

Control amplifier 68 may conveniently be responsive to a second input having reference and modulation signals imposed thereon to modulate the level of the RF signal in response to an information bearing signal.

As described, it will be appreciated that the present invention serves to reduce drive to the RF amplifier under conditions of high VSWR to protect the output transistors thereof from overdriving..

Although the invention has been described in conjunction with preferred embodiments, it will be appreciated that various alterations and arrangements of parts may be made without departing from the spirit and scope of the invention as defined by the apended claims.

What is claimed is:

1. Apparatus for feedback stabilizing an RF amplifier and comprising:
    a variable gain RF amplifier responsive to an input signal for providing an RF output signal, and further responsive to a control input for adjusting the gain of said amplifier;
    a trasmission line connected to the output of said RF amplifier such that said RF output signal propagates along said transmission line;
    amplitude detection means having a plurality of input circuits each responsive to a respective input signal for providing a signal having a value reflective of the peak amplitude of the greater of said input signals;
    means for connecting said input circuits to said transmission line at selected distances from one another whereby said peak signal generated by said detection means reflects a signal amplitude corresponding to at least the amplitude produced when said transmission line is terminated in a matched impedance, and responsive to changing VSWR; and,
    means for supplying said peak signal to said control input of said RF amplifier so as to control the gain of said amplifier in accordance therewith and thereby feedback stabilize said amplifier.

2. Apparatus as set forth in claim 1 wherein said amplitude detection means comprises:
    a plurality of rectifier means respectively serving as said plurality of input circuits to provide respective rectified signals; and,
    filter means commonly connected to said plurality of rectifier means and responsive to the greater of said rectified signals to provide said peak signal.

3. Apparatus as set forth in claim 2 wherein each of said rectifier means comprise unipolar semiconductor means.

4. Apparatus as set forth in claim 2 wherein said filter means comprises:
    a plurality of capacitor means each locally connected to a respective rectifier means; and,
    means for non-additively joining the signals developed across said capacitor means to thereby produce said peak signal.

5. Apparatus as set forth in claim 4 wherein said non-additive joining means comprises means for connecting said capacitor means in parallel.

6. Apparatus as set forth in claim 1 wherein said amplitude detection means includes two input circuits, and wherein said circuits are connected to said transmission line at respective positions thereon being separated by a distance substantially equal to an odd multiple of one-quarter of the wavelength of said RF signal.

* * * * *